United States Patent [19]

Obinata

[11] Patent Number: 5,034,744
[45] Date of Patent: Jul. 23, 1991

[54] DEGLITCHING CIRCUIT

[75] Inventor: Hajime Obinata, Kodaira, Japan

[73] Assignee: Nakamichi Corporation, Tokyo, Japan

[21] Appl. No.: 433,504

[22] Filed: Nov. 8, 1989

[30] Foreign Application Priority Data

Nov. 9, 1988 [JP] Japan .................................. 63-282845

[51] Int. Cl.[5] .............................................. H03M 1/06
[52] U.S. Cl. .................................... 341/118; 341/144
[58] Field of Search ................................ 341/118, 144

[56] References Cited

U.S. PATENT DOCUMENTS

| | | | |
|---|---|---|---|
| 3,877,023 | 4/1975 | Spicer et al. | 341/118 |
| 4,430,641 | 2/1984 | Baur et al. | 341/118 |
| 4,740,776 | 4/1988 | Sloane | 341/118 |
| 4,808,998 | 2/1989 | Yamada | 341/118 |
| 4,814,740 | 3/1989 | Kobayashi | 341/118 |
| 4,918,447 | 4/1990 | Michel | 341/144 |

Primary Examiner—A. D. Pellinen
Assistant Examiner—Marc S. Hoff
Attorney, Agent, or Firm—Dann, Dorfman, Herrell and Skillman

[57] ABSTRACT

A deglitching circuit suppresses a glitch occurring on an output of a digital/analog converting circuit. The deglitching circuit comprises a detector for detecting a status change that will generate the glitch, of digital data to be inputted into the digital/analog converting circuit, a generator for generating in response to an output of the detector a deglitching pulse for suppressing the glitch, and an operation circuit for canceling with the use of the deglitching pulse the glitch occurring on the output of the digital/analog converting circuit converted from the digital data.

8 Claims, 5 Drawing Sheets

DEGLITCHING CIRCUIT

BACKGROUND OF THE INVENTION

1. Field of the Invention

This invention relates to a deglitching circuit for suppressing glitches occuring on outputs of a digital-/analog converter (hereinafter referred to as DAC).

2. Description of the Prior Art

In response to digital data inputted to a DAC, switching circuits of respective bits will be turned on and off. Weighted currents of the bits that have turned on the switching circuits are added to each other to output a current corresponding to the digital data. Due to differences in rise and fall times of the switching circuits, hair-like noises or glitches tend to occur on outputs of DAC. Various circuits have been proposed to suppress such glitches.

An example of conventional deglitching circuit employing a sample holding circuit is shown in FIG. 4. More particularly, a quadruple oversampling digital filter 1 outputs 16-bit serial data. In response to a shift clock SCK generated from a clock control circuit 2, the serial data are sequentially fetched by a DAC 3. When the 16-bit data are completely fetched in DAC 3, the clock control circuit 2 outputs a latch enabling signal LE. Then, DAC 3 perform digital/analog conversion to output a current corresponding to the input digital data. The current is sent to a current/voltage converting circuit comprising an operational amplifier 4 and a negative feedback resistor $R_1$, then to a sample holding circuit 6 comprising resistors $R_2$ and $R_3$, a capacitor $C_1$, an operational amplifier 7 and an analog switch 8. In response to a sample signal SMP from the clock control circuit 2, the sample holding circuit 6 samples an output of the current/voltage converting circuit 5 when no glitch occurs on the output of DAC 3 while the sample holding circuit 6 holds a sampled value during the occurrence of a glitch. An output of the sample holding circuit 6 is sent to a low-pass filter 9 for removing spurious components whose carrier is an integer multiple of a sampling frequency, from the output of the sample holding circuit 6. Then, an output is given at an output terminal $T_1$ of the low-pass filter 9.

According to the deglitching circuit of FIG. 4, the analog switch 8 may cause switching noises to be included in output signals, and the capacitor $C_1$ may deteriorate the sound quality. Thus, fine signals from DAC 3 would often be hidden behind the noises.

FIG. 5 shown another example of conventional deglitching circuit disclosed in the U.S. Pat. No. 4,814,740. In this deglitching circuit, 16-bit serial data is outputted from a quadruple oversampling digital filter 10. In response to a shift clock SCK from a clock control circuit 11, the serial data are sequentially fetched by a serial/parallel converting circuit 12. When the 16-bit data are completely fetched by the circuit 12, the clock control circuit 11 outputs a latch clock RCK so that the 16-bit data may be converted into parallel data. Outputs terminals $O_1$ to $O_{16}$ of the serial/parallel converting circuit 12 are connected to input terminals MSB to LSB of a DAC 13 through resistors $R_{11}$ to $R_{26}$, respectively. DAC 13 converts inputted digital data into parallel data and outputs a current corresponding to the inputted data. DAC 13 is PCM54KP of Burr Brown. This DAC has different circuit arrangements for upper 3 bits and for lower 13 bits. Accordingly, rise (fall) times of switching circuits for the upper 3 bits substantially agree with each other, while rise (fall) times of switching circuits for the lower 13 bits substantially agree with each other. However, the rise (fall) times of the switching circuits for the upper 3 bits and for the lower 13 bits are different from each other. Consequently, even if the serial/parallel converting circuit 12 outputs digital signals whose rise and fall times agree with each other, an output of DAC 13 will contain glitches.

To deal with this problem, the input terminals MSB to 3SB of DAC 13 are connected to a variable voltage source $V_1$ through resistors $R_{27}$ to $R_{29}$ to adjust threshold voltages for turning on and off the switching circuits for the upper 3 bits of DAC 13. Similarly, to adjust threshold voltages of the lower 13 bits, only the input terminals 4SB to 9SB that particularly tend to cause glitches are connected to a variable voltage source $V_2$ through resistors $R_{30}$ to $R_{34}$. The variable voltage sources $V_1$ and $V_2$ are respectively adjusted to make the rise (fall) times of the upper 9 bits agree with each other so that an output of DAC 13 may accompany no glitch. A current output of DAC 13 is converted into a voltage by a current/voltage converting circuit 15 comprising an operational amplifier 14 and a negative feedback resistor $R_{35}$. A low-pass filter 16 will remove spurious components of the voltage output of the current/voltage converting circuit 15. An output is thus given at an output terminal $T_2$ of the low-pass filter 16.

The glitch suppressing circuit of FIG. 5 is effective to overcome drawbacks of the example of FIG. 4. However, since this deglitching circuit employs the serial/parallel converting circuit, it will not be applicable for a DAC designed to directly input serial data.

SUMMARY OF THE INVENTION

It is therefore an object of this invention to provide an improved deglitching circuit capable of overcoming the drawbacks of the conventional techniques.

Another object of the invention is to provide an improved deglitching circuit that can prevent output signals of a DAC from accompanying switching noises to maintain a high sound quality.

Still another object of the invention is to provide an improved deglitching circuit applicable for a DAC adapted to directly receive serial data.

According to an aspect of this invention there is provided a deglitching circuit for suppressing glitches occuring on converted outputs of a DAC, comprising a detecting circuit for detecting status changes that results in generation of glitches in digital data to be inputted into the DAC, a pulse generating circuit for generating deglitching pulses for suppressing the glitches in response to outputs of the detecting circuit, and an operation circuit for cancelling glitches included in converted outputs of the DAC. When the status change resulting in generation of the glitches in the digital data to be inputted into the DAC is detected by the detecting circuit, the deglitching pulses are outputted from the pulse generating circuit. In synchronism with the digital/analog conversion of the DAC, the deglitching pulses are added to the converted outputs of the DAC to suppress the glitches.

BRIEF DESCRIPTION OF THE DRAWINGS

Further objects and advantages of this invention can be fully understood from the following detailed description when read in conjunction with the accompanying drawings in which.

DETAILED DESCRIPTION OF THE EMBODIMENT

TDA1541S1 of Philips is known as a DAC performing digital/analog conversion with high accuracy and have therefore frequently been employed in various digital audio instruments such as a compact disk (CD) player and digital audio tape (DAT) recorder. It has been recognized that this DAC employs high-speed switching circuits to realize glitchless operation, requiring no deglitching circuit. However, the applicant has found by experiment that this DAC of TDA1541S1 still generates glitches of minute level according to certain rules related to input data.

Figure 3:
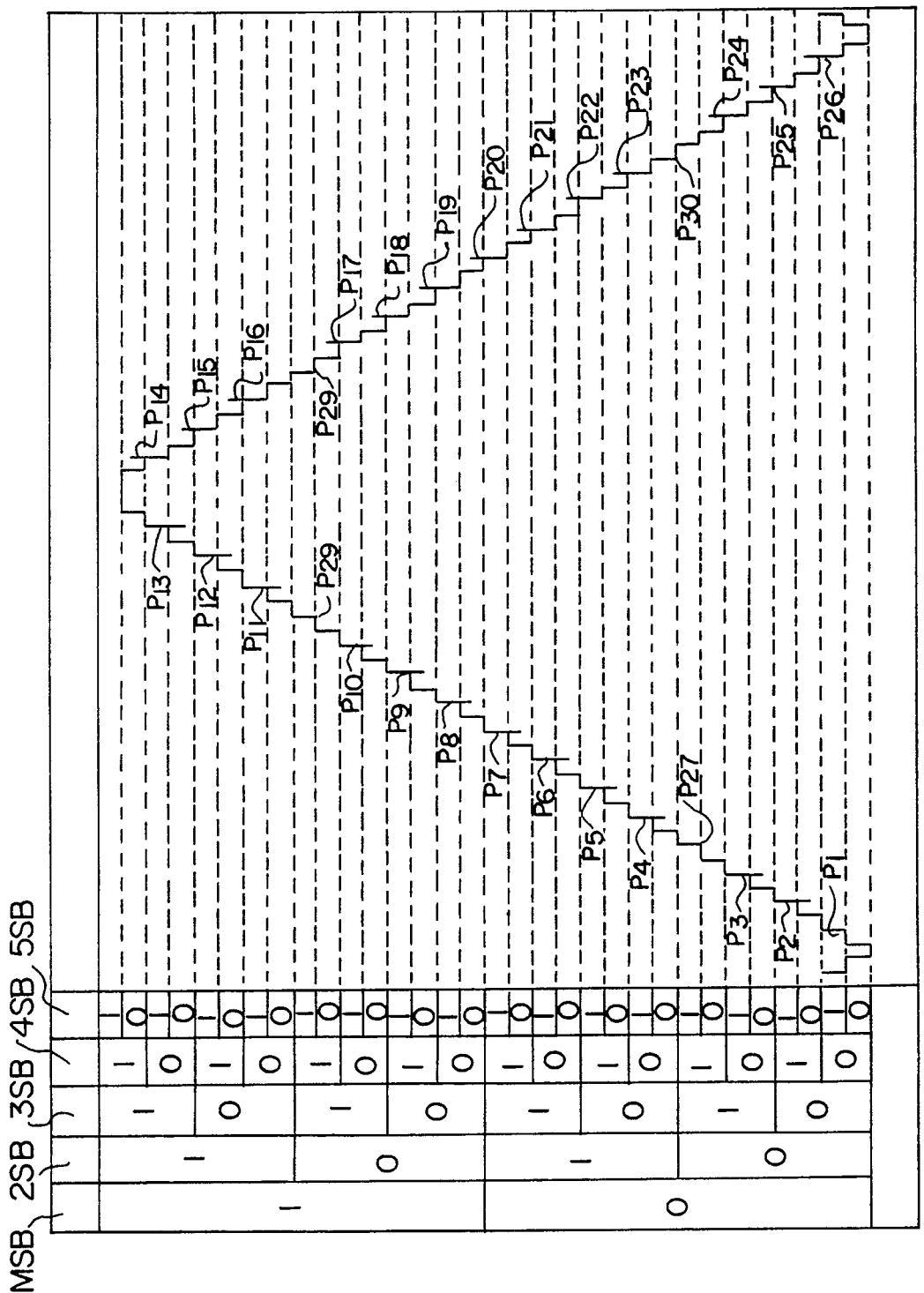
FIG. 3 is a view showing relationship between generation of glitches and status changes in data to be inputted into the DAC in FIG. 1.
Figure 4:
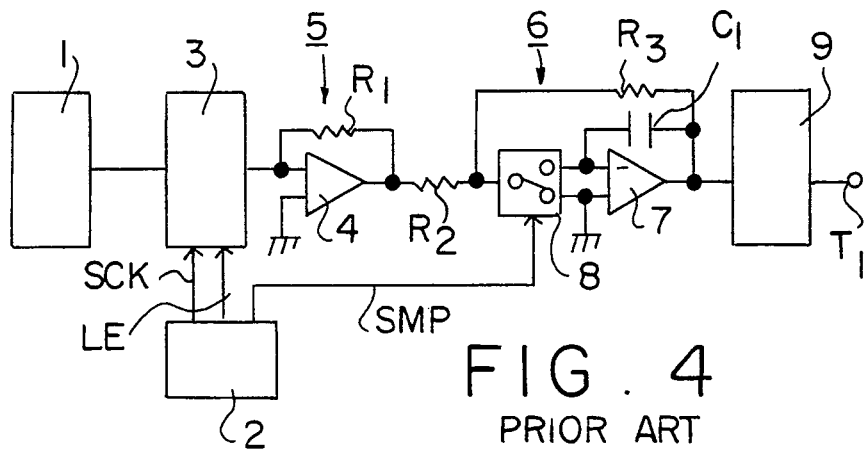
FIGS. 4 and 5 are block diagrams showing conventional deglitching circuits, respectively.
Figure 5:
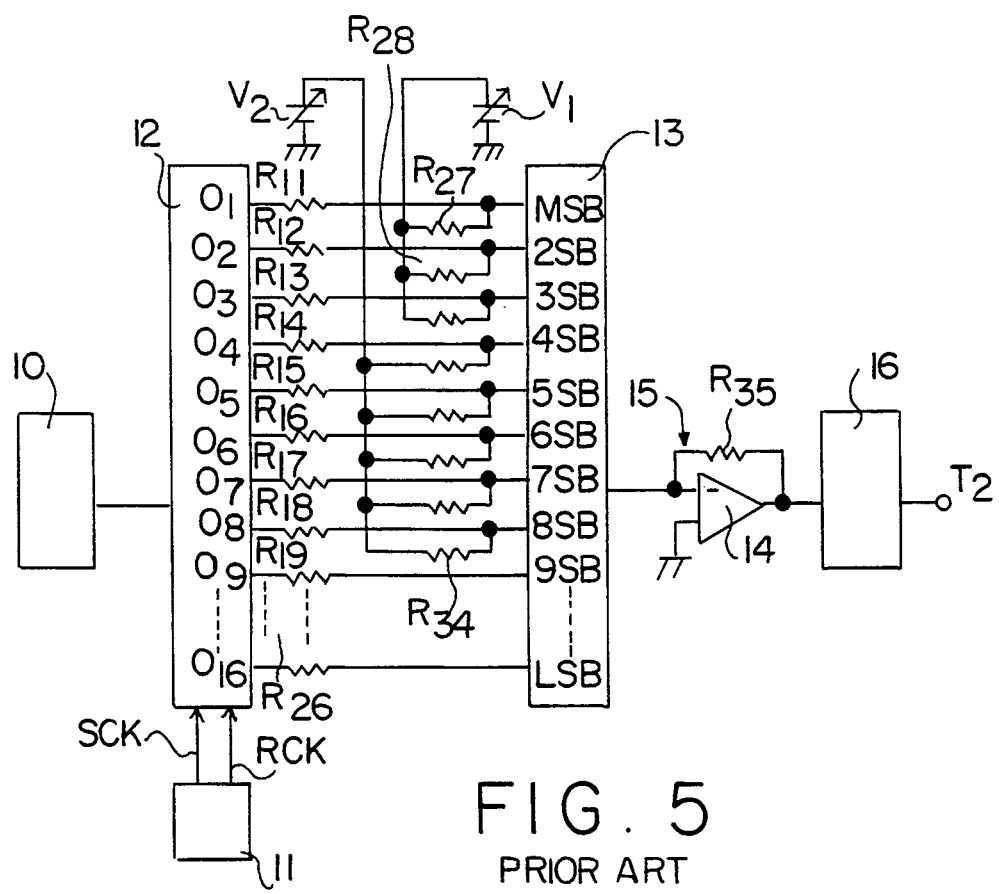

FIG. 3 shows a glitch occurring state of the DAC of TDA1541S1. While the lower 11 bits of data to be inputted to the DAC are all set to "0", only the upper 5 bits of the input data on which glitches tend to occur are increased one by one at a fixed cycle T from a minimum value of "00000" and converted into analog data every time. When a maximum value of "11111" is reached, the upper 5 bits are then reduced one by one and converted into analog data every time. Through these operations, glitches occurring in response to the changes in the input data are plotted to form the graph of FIG. 3, in which the glitches are exaggerated for easier understanding.

As is apparent in FIG. 3, negative glitches occur at points $P_1$ to $P_{13}$ where a bit 4SB changes from "0" to "1", while positive glitches occur at points $P_{14}$ to $P_{26}$ where the bit 4SB changes from "1" to "0". However, when a bit 2SB changes with no change in a bit MSB, no glitch occurs at points $P_{27}$ to $P_{30}$ where the bit 4SB changes. It is also seen that all the glitches have a substantially equal amplitude and time width.

The deglitching circuit of the present invention makes the use of the fact that the DAC of TDA1541S1 demonstrates a regularity in causing glitches and the direction (polarity) thereof with respect to changes in input data. The deglitching circuit of the invention detects status changes of data to be inputted to the DAC and, in response there to, provides deglitching pulses to cancel glitchies occuring on outputs of the DAC.

Figure 1:
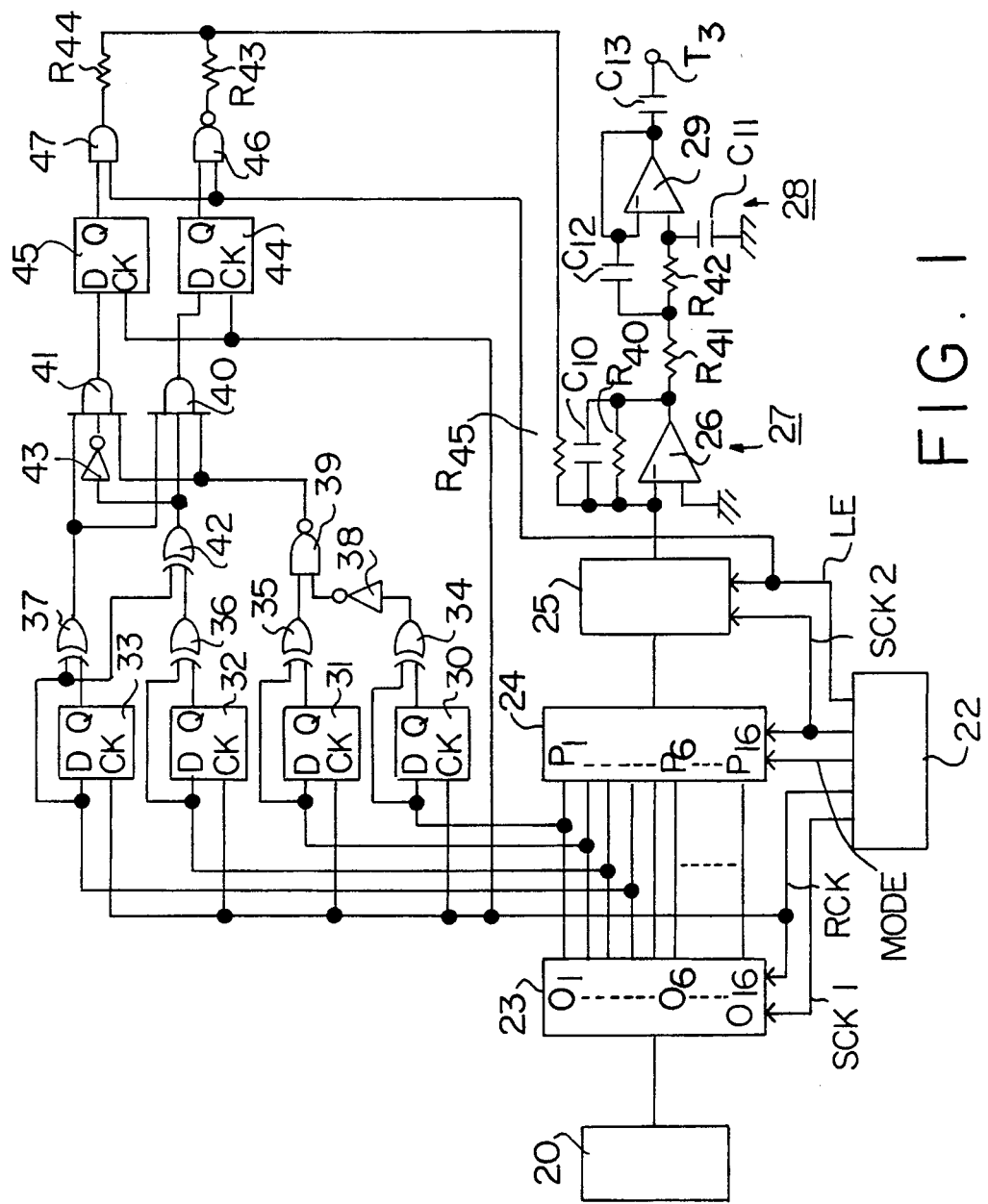
FIG. 1 is a block diagram showing a deglitching circuit embodying the invention which is applied for a DAC to which serial data are to be inputted.

A deglitching circuit according to an embodiment of the invention to be employed in connection with a DA converter of a DAT recorder will be described in detail with reference to FIG. 1.

An octuple oversampling digital filter 20 outputs 16-bit serial data to a serial/parallel converting circuit 23 in response to a predetermined clock. In response to a rise of a shift clock SCK1 provided by a clock control circuit 22, the serial/parallel converting circuit 23 sequentially fetches the input data and then, in response to a rise of a latch clock RCK from the clock control circuit 22, outputs converted parallel data. Output terminals $O_1$ to $O_{16}$ of the serial/parallel converting circuit 23 are connected to input terminals $P_1$ to $P_{16}$ of a parallel/serial converting circuit 24, respectively.

When a mode signal MODE becomes "H" in its level, the parallel/serial converting circuit 24 fetches the input data and, in response to a fall of a shift clock SCK2, outputs serial data sequentially from a bit MSB to a DAC 25. In response to a fall of the shift clock SCK2, DAC 25 fetches the serial data from the parallel/serial converting circuit 24, and converts the data into analog data in response to a rise of a latch enabling signal LE. The converted analog data is outputted from DAC 25 to a current/voltage converting circuit 27.

The current/voltage converting circuit 27 comprises an operational amplifier 26, a resistor $R_{40}$ and a capacitor $C_{10}$. Between an output terminal and an inverted input terminal of the operational amplifier 26, the resistor $R_{40}$ and capacitor $C_{10}$ are connected in parallel. The current/voltage converting circuit 27 will thus convert a current output of DAC 25 into a voltage and also act as a primary low-pass filter. The voltage output of the current/voltage converting circuit 27 is given to a secondary low-pass filter 28.

The secondary low-pass filter 28 comprises an operational amplifier 29, resistors $R_{41}$ and $R_{42}$ and capacitors $C_{11}$ and $C_{12}$. More particularly, the output of the current/voltage converting circuit 27 is passed through the resistors $R_{41}$ and $R_{42}$ and applied to a non-inverted input terminal of the operational amplifier 29 which is grounded through the capacitor $C_{11}$. An output terminal of the operational amplifier 26 is connected to its inverted input terminal. Between the inverted input terminal and a node of the resistors $R_{41}$ and $R_{42}$ is connected the capacitor $C_{12}$.

DAC 25 employed in this embodiment is designed to carry out unipolar operation to output data always of a negative value in response to any input digital data, so that a DC offset will accompany digital data of binary offset. This DC offset may be eliminated by a capacitor $C_{13}$ which receives an output of low-pass filter 28, and an output is obtained at an output terminal $T_3$.

The output terminals $O_1$ to $O_4$ of the serial/parallel converting circuit 23 are connected to data terminals D of D-type flip-flops (hereinafter referred to D-FF) 30 to 33, respectively. A latch clock RCK of the clock control circuit 22 is supplied to clock terminals CK of D-FF's 30 to 33. Output terminals Q and data terminals D of D-FF's 30 to 33 are connected to exclusive OR (E-OR) gates 34 to 37, respectively.

Since a predetermined period of time is required when the serial/parallel converting circuit 23 outputs converted parallel data in response to the latch clock RCK, based on the latch clock RCK, the D-FF's 30 to 33 fetch data previously outputted from the serial/parallel converting circuit 23. If the next data from the output terminals $O_1$ to $O_4$ of the serial/parallel converting circuit 23, i.e., statuses of bits MSB to 4SB of the next data is changed with respect to the previous data, the corresponding E-OR gates 34 to 37 become "H" in their output levels.

An output of E-OR gate 34 is connected to a NAND gate 39 through an inventer 38, and an output of E-OR gate 35 is also connected to NAND gate 39. An output of NAND gate 39 becomes "L" only when a bit 2SB changes with no change of a bit MSB.

An output of E-OR gate 36 and the output terminal $O_4$ of the serial/parallel converting circuit 23 are connected to E-OR gate 42. An output of E-OR gate 42 is connected to and AND gate 40, as well as to an AND gate 41 through an inverter 43. The output of E-OR gate 42 indicates the direction of a change occurring in a data value. When a bit 3SB does not change while a bit 4SB becomes "0", and when the bit 3SB changes while the bit 4SB becomes "1" (namely, a pair of the bits 3SB and 4SB change from "00" to "11", from "01" to "00", from "10" to "01", or from "11" to "10"), it is discriminated that the data value has decreased so that the output of E-OR gate 42 will be "L". On the contrary, when the bit 3SB does not change while the bit 4SB becomes "1", and when the bit 3SB changes while the bit 4SB becomes "0" (namely, a pair of the bits 3SB and 4SB change from "00" to "01", from "01" to "10", from "10" to "11", or from "11" to "00"), it is discriminated that the data value has increased so that the output of E-OR gate 42 will be "H".

The width of a change (an ordinate of FIG. 3) between digital data outputted from the digital filter 20 becomes larger as the frequency of a corresponding analog signal becomes higher and as its level (amplitude) becomes larger. For example, bits MSB to 5SB of digital data may change from "10000" to "01010". In this case, an output of E-OR gate 42 will be "H" because the bit 3SB has not changed while the bit 4SB has become "1". Then, it will erroneously be detected that the data have increased. However, in actual audio signals, a level of high frequency components is fractional in relation to a maximum level. Therefore, the width of a change between data is small so that the above-mentioned circuit arrangement may be sufficient and practical to detect the direction of a change in a data value.

With the above-mentioned circuit arrangement, when the points $P_1$ to $P_{13}$ where the bit 4SB changes from "0" to "1" are detected, an output of AND gate 40 becomes "H". When the points $P_{14}$ to $P_{26}$ where the bit 4SB changes from "1" to "0" are detected, an output of AND gate 41 becomes "H". The outputs of AND gates 40 and 41 are connected to data terminals D of D-FF's 44 and 45, respectively. A latch clock RCK from the clock control circuit 22 is supplied to clock terminals CK of D-FF's 44 and 45. An output terminal Q of D-FF 44 and a latch enabling signal LE are connected to a NAND gate 46. An output terminal Q of D-FF 45 and the latch enabling signal LE are connected to an AND gate 47. Outputs of NAND gate 46 and AND gate 47 are connected to each other through resistors $R_{43}$ and $R_{44}$. A node of the resistors $R_{43}$ and $R_{44}$ and the inverted input terminal of the operational amplifier 26 are connected to each other through a resistor $R_{45}$.

Under a normal state with no deglitching pulse provided, D-FF's 44 and 45 are each of "L" level, NAND gate 46 "H" and AND gate 47 "L", irrespective of a status of the latch enabling signal LE. Therefore, an output voltage of NAND gate 46 is divided by the resistors $R_{43}$ and $R_{44}$, and a predetermined bias current is supplied to the operational amplifier 26 through the resistor $R_{45}$.

When D-FF 44 is "L" and D-FF 45 "H" with the latch enabling signal LE being "H", NAND gate 46 and AND gate 47 are both "H". Then, output voltages of NAND gate 46 and AND gate 47 are added to each other by the resistors $R_{43}$ and $R_{44}$ so that the operational amplifier 26 is provided with double bias current through the resistor $R_{45}$, thus providing an output of DAC 25 with a negative deglitching pulse.

When D-FF 44 is "H" and D-FF 45 "L" with the latch enabling signal LE being "H", NAND gate 46 and AND gate 47 will be both "L". Then, the bias current supplied to the operational amplifier 26 is stopped to provide an output of DAC 25 with a positive deglitching pulse.

When the bias current is supplied to the operational amplifier 26, an output of the operational amplifier 26 generates an offset voltage. However, it is removed by the capacitor $C_{13}$ to raise no problem.

Figure 2A:
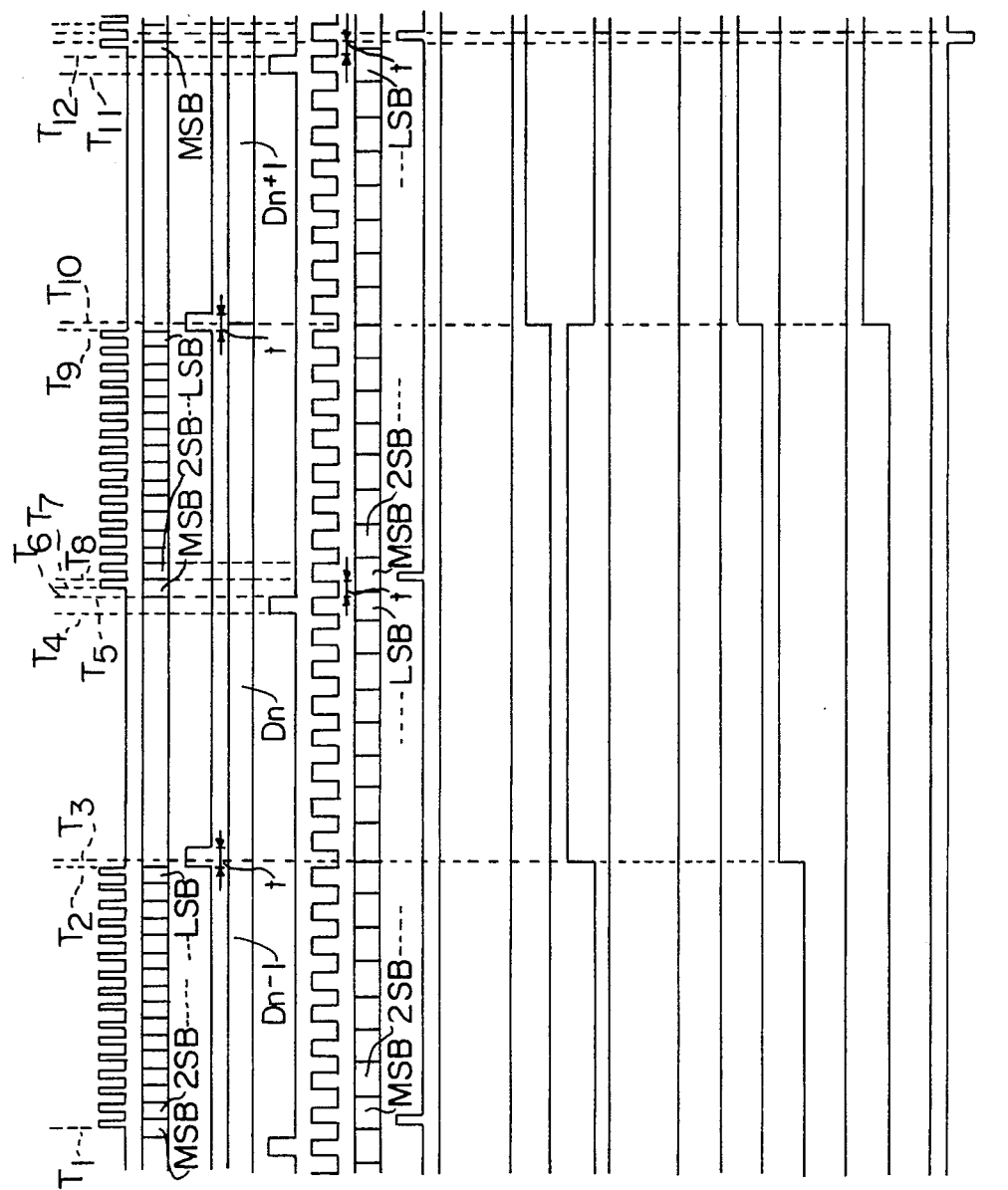
FIGS. 2(a) and 2(b) are timing charts for explaining the operation of the deglitching circuit.
Figure 2B:
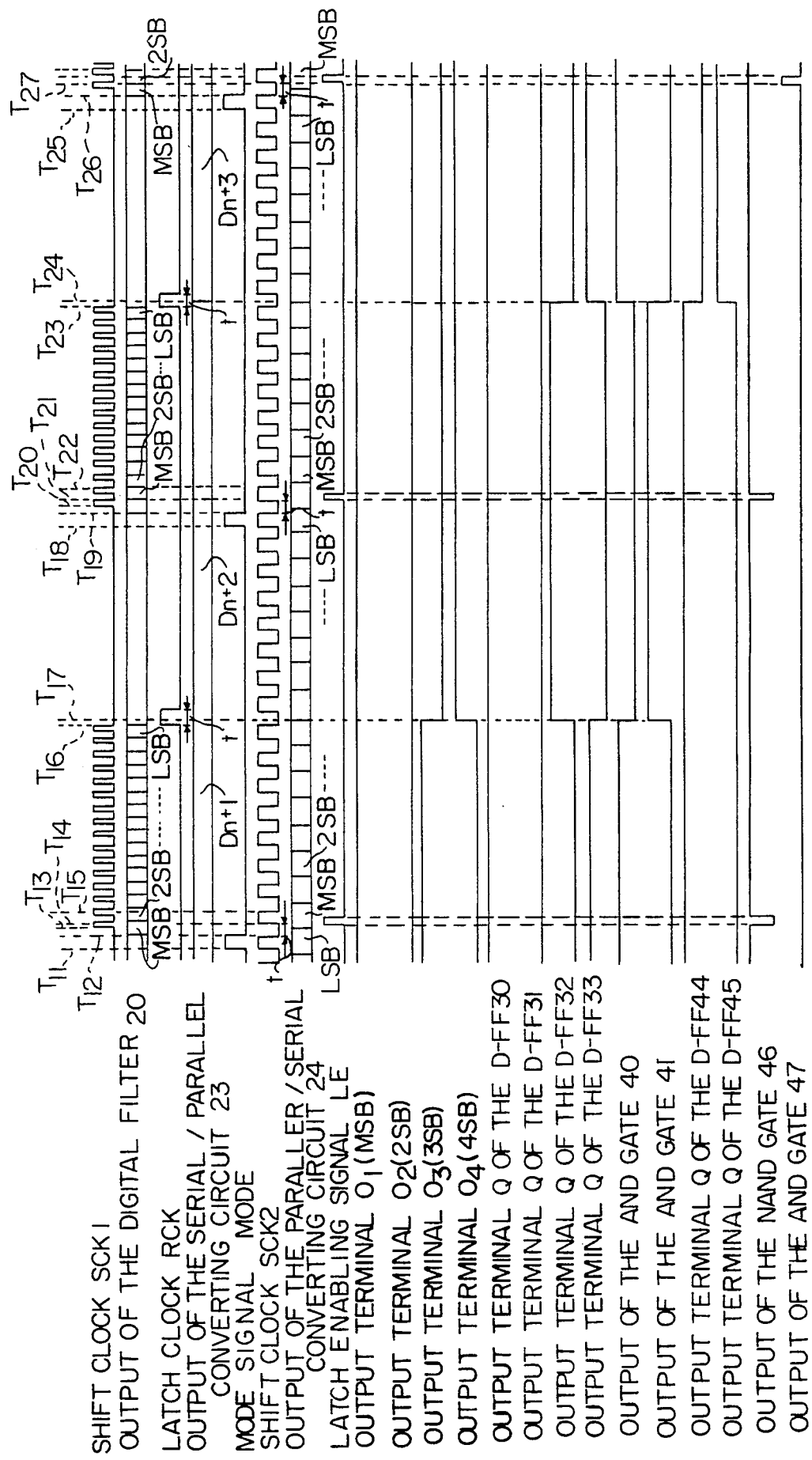

Operation of the above-mentioned circuit arrangement will now be described with reference to timing charts of FIGS. 2(a) and 2(b). For the sake of simplicity of explanation, every circuit delay is supposed to be a period of time t.

After time $T_1$, a shift clock SCK1 rises 16 times at predetermined intervals. In response to the rises of the shift clock SCK1, the serial/parallel converting circuit 23 fetches output bits of the digital filter 20 sequentially from a bit MSB to a bit LSB. 16-bit data Dn has been completely fetched by the serial/parallel converting circuit 23 at time $T_2$, at which time the clock control circuit 22 outputs a latch clock RCK. Then, after the period of time t, that is at time $T_3$, the serial/parallel converting circuit 23 converts the fetched data into 16-bit parallel data Dn and outputs the same.

It is supposed that bits MSB to 4SB of data to be outputted from the serial/parallel converting cirduit 23 are "1000" for second previous data Dn−2, which is changed to "1000" for previous data Dn−1, "1001" for current data Dn, "1010" for next data Dn+1, "1001" for second next data Dn+2 and "1001" for third next data Dn+3.

In response to a rise of the latch clock RCK at time $T_2$, the D-flip-flops 30 to 33 fetch output statuses of the output terminals $O_1$ to $O_4$ of the serial/parallel converting circuit 23, respectively. Since the serial/parallel converting circuit 23 needs the period of time t for outputting parallel data, D-FF's 30 to 33 fetch bits MSB to 4SB of the previous data Dn−1. Therefore, the output terminals Q of D-FF's indicate "H", "L", "L" and "L" levels, respectively. When the serial/parallel converting circuit 23 outputs the data Dn, outputs of E-OR gates 34 to 36 will each be "L", an output of E-OR gate 37 "H", and outputs of NAND gate 39 and E-OR gate 42 "H" so that an output of AND gate 40 will become "H" at the time $T_3$.

In response to a rise of the latch clock RCK, D-FF's 44 and 45 fetch output statuses of AND gates 40 and 41. Then, the output terminals Q of D-FF's 44 and 45 will remain to be "L". Since the outputs of D-FF's 44 and 45 are each "L" and the latch enabling signal LE also "L", outputs of NAND gate 46 and AND gate 47 are "H" and "L" respectively. Therefore, an output voltage of NAND gate 46 is divided by the resistors $R_{43}$ and $R_{44}$ to apply a predetermined bias current to the operational amplifier 26 through the resistor $R_{45}$.

At time $T_4$, a mode signal MODE becmes "H" for a predetermined period of time, and the parallel/serial converting circuit 24 fetching the new data Dn. In response to a fall of a shift clock SCK2 after time $T_5$, the parallel/serial converting circuit 24 outputs, after the period of time t, the data Dn sequentially from a bit MSB.

After time $T_6$, the shift clock SCK1 again rises 16 times. In response to the rises of the shift clock SCK1, the serial/parallel converting circuit 23 fetches outputs of the digital filter 20 sequentially from a bit MSB to a bit LSB.

At time $T_7$, the latch enabling signal LE rises so that DAC 25 converts the already fetched data DN−1 into analog data and outputs the same. Since bits MSB to 4SB of the converted data are equal to those of the previously converted data Dn−2, no glitch occurs on the output of DAC 25. Since the output terminals Q of D-FF's 44 and 45 are each "L", an output of NAND gate 46 stands "H" and an output of AND gate 47 "L" even if the latch enabling signal LE changes to "H", thereby continuously supplying the predetermined bias current to the operational amplifier 26.

In response to a fall of the shift clock SCK2 after time $T_8$, DAC 25 starts to fetch the data Dn sequentially from a bit MSB.

At time $T_9$ the serial/parallel converting circuit 23 has completely fetched the 16-bit data Dn+1, and the latch clock RCK from the clock control circuit 22 rises, so that the serial/parallel converting circuit 23 converts the fetched data into 16-bit parallel data Dn+1 and outputs the same at time $T_{10}$ after the period of time t. In response to the rise of the latch clock RCK at the time $T_9$, the D-FF's 30 to 33 fetch statuses of the output terminals $O_1$ to $O_4$ of the serial/parallel converting circuit 23. At the time $T_{10}$, only the output terminal Q of the D-FF 33 changes to "H".

When the data Dn+1 are outputted from serial/parallel converting circuit 23, outputs of E-OR gates 34 and 35 are each "L", outputs of E-OR gates 36 and 37 each "H" and outputs of NAND gate 39 and E-OR gate 42 each "H". Therefore, outputs of AND gates 40 and 41 remain "H" and "L", respectively. At the rise of the latch clock RCK. D-FF's 44 and 45 fetch the output statuses of AND gates 40 and 41, respectively, so that only the output terminal Q of D-FF 44 will be "H". However, the latch enabling signal LE is still "L" so that outputs of NAND gate 46 and AND gate 47 remain "H" and "L", respectively to continuously flow the predetermined bias current to the operational amplifier 26.

At time $T_{11}$, the mode signal MODE becomes "H" for a predetermined period of time, and the parallel/serial converting circuit 24 fetches the new data Dn+1. In response to a fall of the shift clock SCK2 after time $T_{12}$, the parallel/serial converting circuit 24 outputs the data Dn+1 sequentially from a bit MSB after the period of time t.

After time $T_{13}$, the shift clock SCK1 again rises 16 times. In response to the rises of the shift clock SCK1, the serial/parallel converting circuit 23 fetches outputs of the digital filter 20 sequentially from a bit MSB to a bit LSB.

At time $T_{14}$, the latch enabling signal LE rises, and DAC 25 converts and outputs the fetched data Dn. Since upper four bits of the converted data change from "1000" to "1001", a negative glitch will occur on the output of DAC 25. Meanwhile, the output terminals Q of D-FF's 44 and 45 indicate "H" and "L" levels, respectively. Therefore, with the latch enabling signal LE of "H" level, outputs of NAND gate 46 and AND gate 47 are each "L" so that supply of the bias current to the operational amplifier 26 is stopped. Then, a positive deglitching pulse is added to the output of DAC 25 to cancel the occuring negative glitch.

In response to a fall of the shift clock SCK2 after time $T_{15}$, DAC 25 starts to fetch the data Dn+1 sequentially from a bit MSB.

At time $T_{16}$ after the serial/parallel converting circuit 23 completely fetches the 16-bit data Dn+2, the clock control circuit 22 raises the latch clock RCK. Then, the serial/parallel converting circuit 23 converts the fetched data and outputs 16-bit parallel data Dn+2 after the period of time t, at time $T_{17}$.

In response to a rise of the latch clock RCK at the time $T_{16}$, D-FF's 30 to 33 fetch statuses of the output terminals $O_1$ $O_4$ of the serial/parallel converting circuit 23, and only the output terminals Q of D-FF's 32 and 33 change "H" "L", respectively.

When the serial/parallel converting circuit 23 outputs the data Dn+2, outputs of E-OR gates 34 and 35 become each "L", outputs of E-OR gates 36 and 37 each "H", an output of NAND gate 39 "H" and output of E-OR gate 42 "L". Then, at the time $T_{17}$, outputs of AND gates 40 and 41 change to "L" and "H", respectively. In response to a rise of the latch clock RCK, D-FF's 44 and 45 fetch the output statuses of AND gates 40 and 41, respectively. Then, the output terminals Q of D-FF's 44 and 45 indicate "H" and "L" levels, respectively. Since the latch enablining signal LE is "L", outputs of NAND gate 46 and AND gate 47 remain "H" and "L", respectively. Therefore, the predetermined bias current is supplied to the operational amplifier 26.

From time $T_{18}$, the mode signal MODE is "H" for a predetermined period of time, and the parallel/serial converting circuit 24 fetches the new data Dn+2. In response to a fall of the shift clock SCK2 after time $T_{19}$, the parallel/serial converting circuit 24 outputs the data Dn+2 sequentially from a bit MSB after the period of time t.

After time $T_{20}$, the shift clock SCK1 again rises 16 times. In response to the rises of the shift clock SCK1, the serial/parallel converting circuit 23 fetches outputs of the digital filter 20 sequentially from a bit MSB to a bit At time $T_{21}$, the latch enabling signal LE rises, and DAC 25 converts the already fetched data Dn+1 into analog data and outputs the same. Since upper 4 bits of the converted data change from "1010", a negative glitch occurs on the output of DAC 25. Meanwhile, the output terminals Q of D-FF's 44 and 45 indicate "H" and "L" levels, respectively. With the latch enabling signal LE being "H", outputs of NAND gate 46 and AND gate 47 become each "L" so that supply of the bias current to the operational amplifier 26 is stopped. Then, a positive deglitching pulse is added to the output of DAC 25 to cancel the occurring negative glitch.

In response to a fall of the shift clock SCK2 after time $T_{22}$, DAC 25 starts to fetch the data Dn+2 sequentially from a bit MSB.

At time $T_{23}$ after serial/parallel converting circuit 23 completely fetches the 16-bit data Dn+3, the clock control circuit 22 raises the latch clock RCK. The serial/parallel converting circuit 23 converts the fetched data into 16-bit parallel data Dn+3 and outputs the same after the period of time t, at time $T_{24}$.

In response to a rise of the latch clock RCk at the time $T_{23}$, D-FF's 30 to 33 fetch statuses of the output terminals $O_1$ to $O_4$ of sereal/parallel converting circuit 23, and only the output terminals Q of D-FF's 32 and 33 change to "L" and "H", respectively.

When the serial/parallel converting circuit 23 outputs the data Dn+3, outputs of E-OR gates 34 to 37 become each "L", an output of NAND gate 39 "H" and an output of E-OR gate 42 "H". Then, at the time $T_{24}$, an output of AND gate 41 changes to "L". In response to a rise of the latch clock RCK, D-FF's 44 and 45 fetch output statuses of AND gates 40 and 41, and the output terminals Q of D-FF's 44 and 45 change to "L" and "H", respectively. Since the latch enabling signal LE is "L", outputs of NAND gate 46 and AND gate 47 remain "H" and "L", respectively, so that the predetermined bias current is continuously supplied to the operational amplifier 26.

At time $T_{25}$, the mode signal MODE becomes "H" for a predetermined period of time, and the parallel/serial converting circuit 24 fetches the new data $Dn+3$. In response to a fall of the shift clock SCK2 after time $T_{26}$, the parallel/serial converting circuit 24 outputs the data $Dn+3$ sequentially from a bit MSB after the period of time t.

After time $T_{27}$, the shift clock SCK1 again rises 16 times. In response to the rises of the shift clock SCK1, the serial/parallel converting circuit 23 fetches outputs of the digital filter 20 sequentially from a bit MSB to a bit LSB through the inverter 21.

At time $T_{28}$, the latch enabling signal LE rises, and the DAC 25 converts the already fetched data $Dn+2$ into analong data and outputs the same. Since upper 4 bits of the converted data change from "1010" to "1001", a positive glitch occurs on the output of DAC 25. Meanwhile, the output terminals Q of D-FF's 44 and 45 are "L" and "H", respectively, so that outputs of NAND gate 46 and AND gate 47 may become each "H" with the latch enabling signal LE being "H". Then, a bias current of substantially double magnitude is supplied to the output of DAC 25 to apply a negative deglitching pules to the output of DAC 25 to cancel the occurring positive glitch.

After that, the above-described operations are repeated. If a bit 2SB changes with no change in a bit MSB, an output of NAND gate 39 will be "L". Therefore, even if a bit 4SB changes to make an output of E-OR gate 37 to be "H", AND gates 40 and 41 will each be "L" to perform no deglitching operation.

Although only a specific embodiment of the invention has been described in detail with reference to the accompanying drawings, it is to be understood that the invention is not limited to the illustrated embodiment and various changes and modifications may be made without departing from the scope and spirit of the invention as defined in the appended claims. For example, in the above embodiment, the width of a deglitching pulse has been determined by the time width of a high state of the latch enabling signal LE. Instead, a delay circuit, etc., may be employed to adjust the width, or the resistor $R_{45}$ may be a semi-fixed resistor to adjust its amplitude. Alternatively, the resistors $R_{43}$ and $R_{44}$ may be semi-fixed resistors to adjust their amplituides in positive and negative directions. Although DC offset has been removed by the capacitor $C_{13}$ in the embodiment, the DC offset may be removed by arranging, for example, a DC offset may be removed by arranging, for example, a DC servo circuit.

What is cliamed is:

1. A deglitching circuit for suppressing glitches occurring on an output of a digital/analog converting circuit, comprising:
    a detecting circuit for detecting a status change of the digital data to be inputted to the digital/analog converting circuit, said status change causing the output of the digital/analog converting circuit to generate the glitches;
    a generating circit for generating, in response to a detecting output of said detecting circuit, a deglitching pulse for suppressing the glitch; and
    an operation circuit for canceling, in accordance with the deglitching pulse, the glitch occurring on the output of the digital/analog converting circuit.

2. A deglitching circuit for suppressing positive and/or negative glitches occurring on an output of a digital/analog converting circuit, comprising:
    a first detecting circuit for detecting a status change of the digital data to be inputted to the digital/analog converting circuit, said status change causing the output of the digital/analog converting circuit to generate the glitches;
    a second detecting circuit for detecting if the glitch occurring at the time of the status change detected by said first deteching circuit has a positive or negative value;
    a generating circuit for generating, in response to detecting outputs of said first and second detecting circuit, a deglitching pulse for suppressing the glitch; and
    an operation circuit for canceling, in accordance with the deglitching pulse, the glitch occurring on the output of the digital/analog converting circuit.

3. The deglitching circuit according to claim 2 wherein the digital data to be processed comprises parallel data outputted in response to a latch clock and the digital/analog converting circuit employed comprises a digital/analog converter designed to accept serial data, and which further comprises a parallel/serial converting circuit operated to fetch the parallel data in response to a mode signal and then to convert in response to a shift clock the fetched parallel data into corresponding serial data, said serial data being outputted to said ditigal/analog converter in response to the shift clock and converted thereby into an analog signal in response to a latch enabling signal.

4. The deglitching circuit according to claim 3 wherein said first detecting circuit comprises a first status holding circuit operated to fetch in response to the latch clock statuses of n-significant-bits of the digital data to be outputted therefrom; and a first exclusive OR gate for outputting an exclusive OR of the statuses of n-significant-bits and output statuses of said first status holding circuit.

5. The deglitching circuit according to claim 4 wherein said second detecting circiut comprises a second status holding circuit operated to fetch in response to the latch clock statuses of $(n-1)$-significant-bits of the digital data to be outputted therefrom; a second exclusive OR gate for outputting an exclusive OR of the statuses of $(n-1)$-significant-bits and output statuses of said second status holding circuit; and a third exclusive OR gate for outputting and exclusive OR of the statuses of n-significant-bits and output statuses of said second exclusive OR gate.

6. The deglitching circuit according to claim 5 wherein said generating circuit comprises an inverting circuit for inverting the output statuses of said third exclusive OR gate to be outputted therefrom; a first AND gate for gating the output statuses of said first exclusive OR gate at the output statuses of said inverting circuit; a second AND gate for gating the output statuses of said first exclusive OR gate at the output statues of said third exclusive OR gate; a third status holding circuit operated to fetch in response to the latch clock the output statuses of said first AND gate to be outputted therefrom; a fourth status holding circuit operated to fetch in response to the latch clock the output statuses of said second AND gate; a third AND gate for gating the output statuses of said third status holding circuit in response to the latch enabling signal; and a NAND gate for gating the output statuses of said fourth status holding circuit in response to the latch enabling signal.

7. The deglitching circuit according to claim 6 wherein said operation circuit comprises a current/voltage converting circuit for converting a current output of said digital/analog converter into a corresponding voltage; and resister means for adding the outputs of said third AND gate and said NAND gate to the current output of said digital/analog converter.

8. The deglitching circuit according to claim 7 wherein said operation circit further comprises means for removing DC offsect arising in the outputs of said current/voltage converting circuit.

* * * * *

UNITED STATES PATENT AND TRADEMARK OFFICE
CERTIFICATE OF CORRECTION

PATENT NO. : 5,034,744

DATED : July 23, 1991

INVENTOR(S) : Hajime Obinata

It is certified that error appears in the above-identified patent and that said Letters Patent is hereby corrected as shown below:

Column 6, line 42, after "42" insert --each--;

line 54, delete "becmes" and insert --becomes--;

line 56, delete "fetching" and insert --fetches--.

Column 8, line 5, after "$O_1$" insert --to--;

line 7, after "H" insert --and--;

line 34, after "bit" insert --LSB.--;

line 38, after "from" insert --"1001" to--;

line 56, delete "RCk" and insert --RCK--.

Column 9, line 29, delete "pules" and insert --pulse--.

Column 10, Claim 2, line 14, delete "deteching" and insert --detecting--.

Column 10, Claim 5, line 45, delete "circiut" and insert --circuit--.

Column 12, Claim 8, line 6, delete "circit" and insert --circuit--.

UNITED STATES PATENT AND TRADEMARK OFFICE
CERTIFICATE OF CORRECTION

PATENT NO. : 5,034,744

DATED : July 23, 1991

INVENTOR(S) : Hajime Obinata

It is certified that error appears in the above-identified patent and that said Letters Patent is hereby corrected as shown below:

Column 12, Claim 8, line 7, delete "offsect" and insert --offsets--.

Signed and Sealed this

Twenty-third Day of February, 1993

Attest:

STEPHEN G. KUNIN

Attesting Officer

Acting Commissioner of Patents and Trademarks